United States Patent [19]

Susak et al.

[11] Patent Number: 4,725,791

[45] Date of Patent: Feb. 16, 1988

[54] CIRCUIT UTILIZING RESISTORS TRIMMED BY METAL MIGRATION

[75] Inventors: David M. Susak, Mesa; William F. Davis; Robert L. Vyne, both of Tempe, all of Ariz.

[73] Assignee: Motorola, Inc., Schaumburg, Ill.

[21] Appl. No.: 908,858

[22] Filed: Sep. 18, 1986

[51] Int. Cl.$^4$ ............................. H03F 3/10; H03F 3/45
[52] U.S. Cl. ..................................... 330/261; 330/296; 330/307; 357/51
[58] Field of Search .................... 330/261, 307, 296; 29/584, 586; 148/183, 188, DIG. 136; 357/51

[56] References Cited

U.S. PATENT DOCUMENTS 4,606,781  8/1986  Vyne .................................. 148/183

Primary Examiner—James B. Mullins
Attorney, Agent, or Firm—Vincent B. Ingrassia

[57] ABSTRACT

An operational amplifier of the type which includes first and second differentially coupled input transistors which cooperate with a current mirror circuit also includes a first and second RTMM resistors which may be individually trimmed to reduce input offset voltage. Each RTMM resistor is coupled from the power supply rail through first and second diodes respectively to the first and second input terminals. In this manner, signals appearing on the input terminals which exceed the rail voltage will cause currents to flow through the RTMM resistors thus reducing their resistance, and reducing offset voltage.

10 Claims, 7 Drawing Figures

CIRCUIT UTILIZING RESISTORS TRIMMED BY METAL MIGRATION

BACKGROUND OF THE INVENTION

This invention relates generally to integrated circuits and, more particularly, to an integrated circuit such as an operational amplifier wherein a parameter of the circuit such as input offset voltage is trimmed by metal migration.

The term "trimming" as used herein means the fine adjustment of parameters such as resistance, capacitance, or inductance in an integrated circuit. Also, as used herein, the term "metal migration" refers to the movement of metal into a semiconductor crystal such as a resistor by passing current pulses of high amplitude and generally small pulse width through the resistor.

As is well known, it is often times necessary to "match" (i.e. make electrically identical) resistors, transistors, diodes, etc. or to set the absolute value of a single electronic device to a certain value (i.e. trimming a resistor to establish a desired current level). This is done, for example, to minimize the input offset voltage of an operational amplifier.

Resistor trimming is, by far, the most common method of adjusting electrical parameters on integrated circuits. Two methods are generally known. The first utilizes a trim potentiometer external to the semiconductor device but connected to it through pins (e.g. on the printed circuit board). The second method involves trimming the resistor on an integrated circuit die itself, usually while in wafer form.

Resistors may be trimmed mechanically by means of abrasion, usually sand blasting, and laser shaping of a conductive layer. Another approach is to blow fuses which involves the vaporization of metal by passing high current therethrough. Zener zapping involves the short circuiting of diodes by means of excessive current. In addition, the resistance of resistors may be altered chemically as by anodizing.

Known methods of resistor trimming on the die have serious disadvantages. Laser trimming equipment is very expensive and its maintenance and programming extremely critical and costly. The blowing of fuses can result in service contamination and cracks in the protective glass layer which, in turn, may cause poor reliability. Zener zapping requires dedicated circuitry which may amount to over 20% of the die area.

A further disadvantage in the well known methods of resistor trimming on the die is characterized in that after the die is trimmed (usually while in wafer form) it is scribed and assembled in a package. The assembly process places stresses on the semiconductor chip which can cause the trim resistor to change in value due to piezoresistive effects.

It is now known that a specially designed diffused resistor on an integrated circuit die may be trimmed by metal migration. This is accomplished by pulsing the resistor with high amplitude, small duty cycle current pulses. This approach is especially useful in production and has definite advantages over laser trimming, link blowing, or zener zapping. First, the resistors can now be trimmed after the integrated circuit is packaged. Second, the resistor trimmed by metal migration (RTMM) occupies very little die area. Third, when using RTMM resistors, a test computer performs a trim algorithm, not digital logic on the chip. Fourth, RTMM resistors exhibit increased accuracy and resolution; i.e. they undergo resistance changes as small as 25 milliohms/pulse on a 25 ohm resistor. Finally, no additional expensive equipment is required.

Assuming a silicon substrate and aluminum contacts, when small duty cycle current pulses are applied to the RTMM resistors, electron momentum exchange causes some movement of silicon and aluminum atoms in the direction of electron current flow, commonly referred to as elctromigration. As the resistor temperature rises, however, the ability of aluminum to dissolve silicon increases. This phenomenon causes an aluminum filament to grow from the positive terminal, dissolving silicon as it grows, towards the negative terminal, against the flow of electrons. As the filament grows, the resistive value decreases.

It would therefore be desirable to provide circuitry which is configured so as to incorporate the desirable features of RTMM resistors.

SUMMARY OF THE INVENTION

It is an object of the present invention to provide circuitry, a parameter of which may be altered by trimming RTMM resistors utilized therewith.

It is a further object of the present invention to provide an operational amplifier integrated circuit having an input offset voltage ($V_{os}$) which may be trimmed through the use of RTMM resistors.

According to a broad aspect of the invention there is provided an apparatus for altering an electrical parameter of a utilization circuit having at least first and second inputs and at least a first power supply rail, said apparatus comprising diode means coupled between the at least first and second inputs for conducting current from the first input to the second input when the voltage at the first input exceeds a predetermined value, and RTMM resistor means coupled between the second input and the power supply rail.

According to a further aspect of the invention there is provided an apparatus wherein said utilization circuit comprises an operational amplifier integrated circuit formed in a semiconductor substrate of the type which includes first and second differentially coupled input transistors each having a base electrode coupled to first and second input terminals respectively, and each having emitter and collector terminals, first means for coupling to the emitter terminals of the first and second input transistors for supplying current thereto; and current mirror means coupled to the collector terminals of the first and second input transistors.

The above and other objects, features, and advantages of the present invention will be more clearly understood from the following detailed description taken in conjunction with the accompanying drawings, in which:

DESCRIPTION OF THE PREFERRED EMBODIMENT

Figure 1:
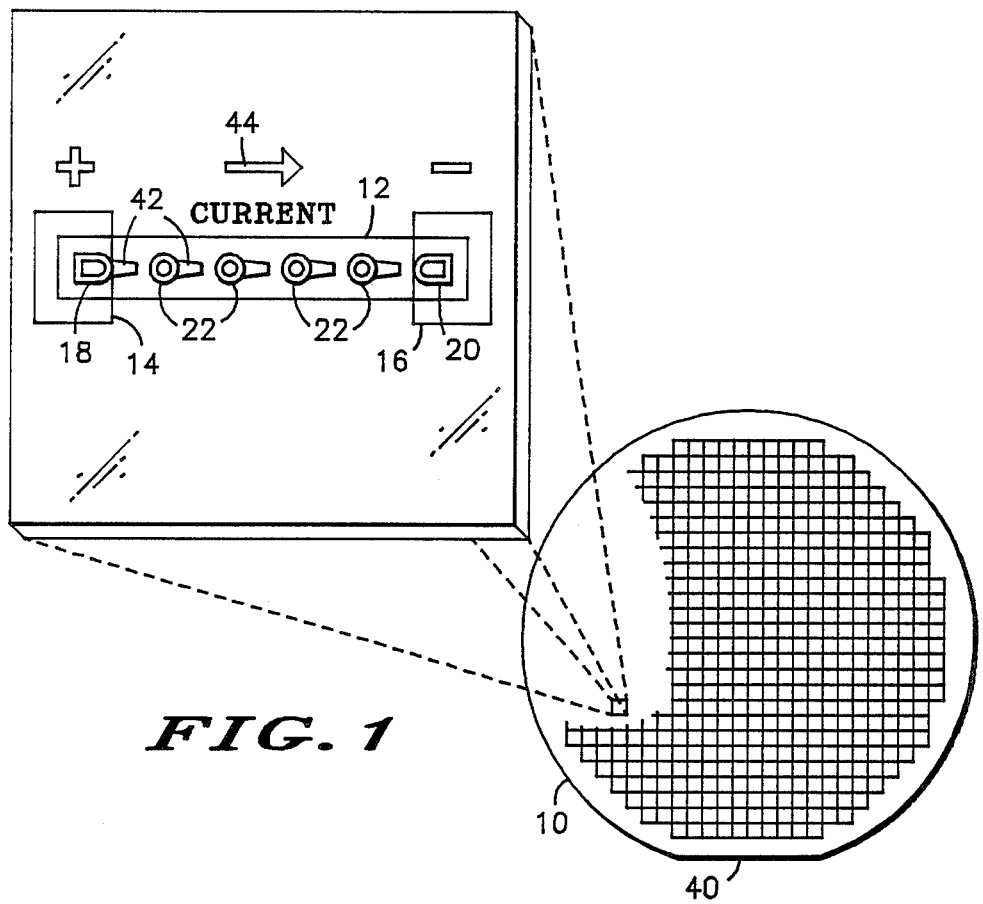
FIG. 1 is a top view of an RTMM resistor on a semiconductor wafer trimmed by passing current pulses therethrough in a proper direction.

FIG. 1 is a top exploded view of a {111} oriented silicon wafer 10 having a diffused resistor 12 thereon. Contact pads 14 and 16 are provided for contacting metallic (e.g. aluminum) contacts 18 and 20 respectively at opposite ends of the resistor. In addition, a plurality of intermediate metallic contacts 22 are provided.

Figure 2:
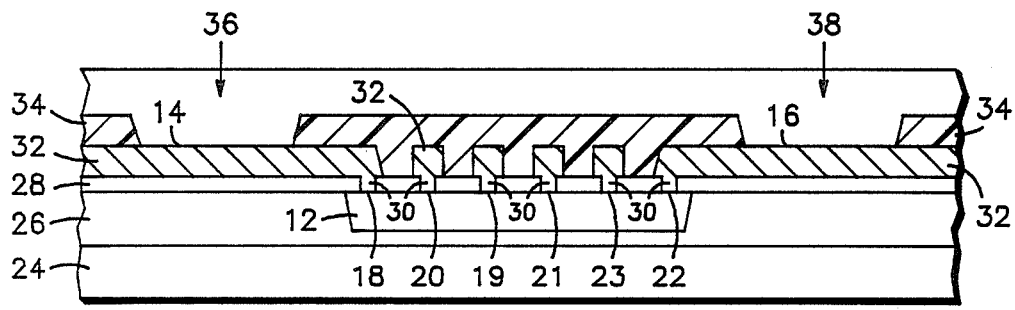
FIG. 2 illustrates in cross-section the RTMM resistor of FIG. 1.

FIG. 2 is a cross-sectional view illustrating the typical manner in which the resistor shown in FIG. 1 is constructed. A P-type silicon substrate 24 is layer covered by an N-type epitaxial layer 26. Resistive region 12 is formed by, for example, diffusing an N-type dopant into epitaxial layer 26. An insulating layer 28, preferably nitride, is deposited over epitaxial layer 26 and openings 30 are etched therein. A metal layer 32 is then deposited over the insulating layer 28 and into openings 30 thus creating metal contacts 18, 19, 20, 21, 22 and 23. A protective glass layer 34 is deposited over metal 32 and openings 36 and 38 formed therein so as to provide access to pads 14 and 16.

Figure 3:
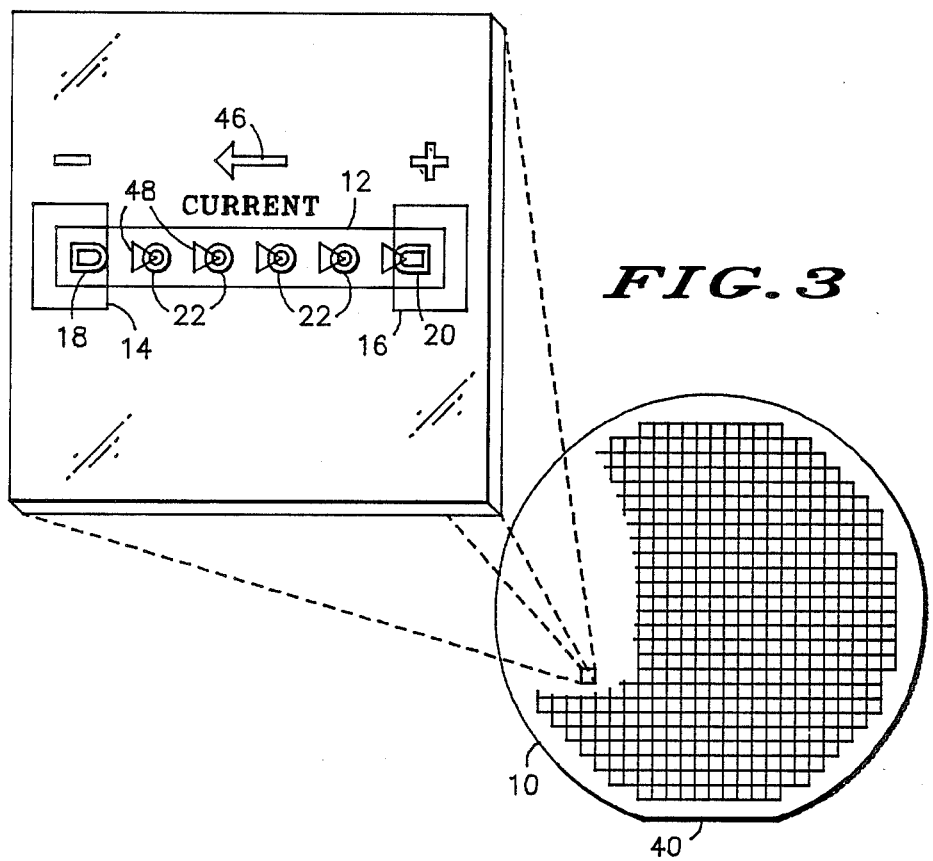
FIG. 3 is a top view of an RTMM resistor on a semiconductor wafer trimmed by passing current therethrough in an improper direction.

It was discovered that when using a {111} oriented silicon wafer 10 having a diffused resistor 12 running parallel to the [110] flat 40 that there was a difference in the shape of the aluminum flow into the silicon towards the negative terminal that was dependent upon the direction of electron flow in resistor 12 during trimming. That is, referring to wafer 10 in FIG. 1 having a flat 40 at the bottom (6 o'clock), if the electron flow is from right to left and conventional current is from left to right as indicated by arrow 44, a narrow filament of aluminum 42 is observed to grow from contacts 18 and 22 into the silicon to the right of that contact. If, however, electron flow during trim is from left to right and conventional current is from right to left as indicated by arrow 46 in FIG. 3, a comparatively wide area of aluminum 48 forms to the left of the aluminum contact.

This behavior is attributed to the directions of the {111} crystal planes in the silicon relative to the direction of the aluminum-silicon alloy filament growth. The {111} planes are the close-packed planes making it most difficult to dissolve silicon in direction normal to these planes. The dissolving of silicon takes place more readily in directions that are not normal to the {111} planes. Thus, it is much easier for the silicon to dissolve in any of the three directions corresponding to the intersection of the {111} planes than it does normal to the {111} planes. If a resistor to be trimmed is formed parallel to the wafer flat, a narrow filament of aluminum-silicon alloy grows to the right when the trimming high current electrons flow to the left (viewed with the wafer flat at 6 o'clock). The filament is fairly narrow since widening of the filament would require dissolution in a direction with a component normal to the (111) plane.

If, on the other hand, the trimming current were reversed so that electrons move from left to right in the above oriented resistor, a very wide filament of aluminum-silicon alloy would grow to the left of the contacts since it is easier to dissolve silicon from the crystal in directions parallel to the {111} planes than near normal to them.

Since there are three directions in the {111} oriented crystals in which etch pit facets intersect, there are three optimum directions in which resistors can be constructed. These are 120 degrees apart and are in the crystal directions [11$\bar{2}$], [1$\bar{2}$1]and [$\bar{2}$11]. A narrow filament of alloy would grow from an ohmic contact in a direction opposite to the electron flow if the electron flow were directed towards a point of the etch pit. Similarly, a wide filament would grown from the ohmic contact opposite the direction of electron flow if the electron flow were directed towards a flat of the etch pit.

In the case of a {100} oriented silicon wafer, there are two directions in which the {111} planes intersect to form a four-sided pyramid shaped etch pit. Thus, there are two directions along which trimmable resistors can be constructed which would produce narrow filaments in the direction opposite to the electron flow. These are the [010] and the [001] directions and are located at angles 45 degrees and 135 degrees from the [011] oriented flat. A more detailed discussion of the crystallographic orientation of silicon wafers can be found in "OPTIMUM CRYSTALLOGRAPHIC ORIENTATION FOR SILICON DEVICE FABRICATION" by Duane O. Townley, Solid State Technology, January, 1973, pages 37–41.

As suggested above, the directions in which resistors can be constructed and exhibit the desired natural filament growth are related to the crystallographic direction of the wafer. That is, the etch pit in {111} silicon consists of three intersecting {1·11} planes forming a tetrahedron shaped pit. The intersections of the {111} planes point in three directions 120 degrees apart. It will be noted that an etch pit point containing an intersection of two (111) planes is directed parallel to the flat of the wafer and to the right. To the left of the etch pit there exists a (111) plane. Thus, it is easier to dissolve silicon from the crystal into the alloy along the intersection of two (111) planes to the right than it would from the (111) plane to the left.

Figure 4:
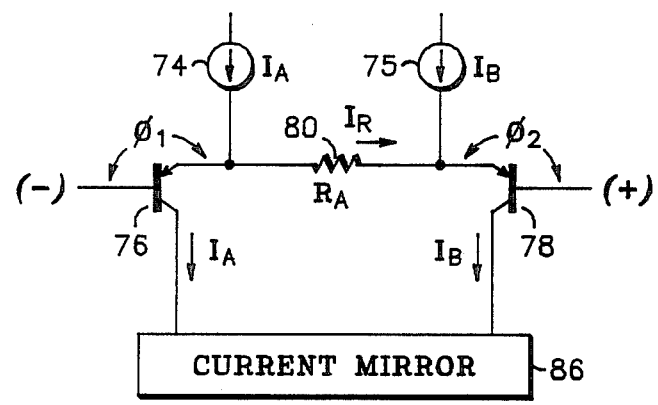
FIG. 4 is a schematic diagram illustrating how input offset voltage may be calculated.

FIG. 4 illustrates the input stage of an operational amplifier comprising current sources 74 and 75 which generate currents $I_A$ and $I_B$ respectively, first and second PNP input transistors 76 and 78 each having a base electrode coupled to a differential input signal, and an emitter resistor 80 having resistance $R_A$. As can be seen, resistor 80 is coupled between the emitter of transistor 76 and the emitter of transistor 78. Assuming, for example, that $I_A = I_B$ and all like elements are substantially identically matched, then the collectors of transistors 76 and 78 will conduct currents $I_A$ and $I_B$ respectively. Furthermore, current $I_R$ will equal zero. Since the collectors of transistors 76 and 78 are coupled to a current mirror circuit 86 in the well known manner, the ratio of collector currents (and emitter currents) of transistors 76 and 78 remain constant, independent of $I_A$ or $I_B$.

The input offset voltage $V_{OS}$ appearing across the base terminals of transistors 76 and 78 may be defined as $$V_{OS} = \phi_1 - R_A(I_A - I_B)/2 - \phi_2$$

where $\phi_1$ and $\phi_2$ are the base emitter voltages of transistors 76 and 78 respectively. It should be apparent that should an offset voltage exist, it may be substantially eliminated by changing the current flowing through resistor $R_A$ by altering the value of $I_A$ with respect to $I_B$, or $I_B$ with respect to $I_A$.

Figure 5:
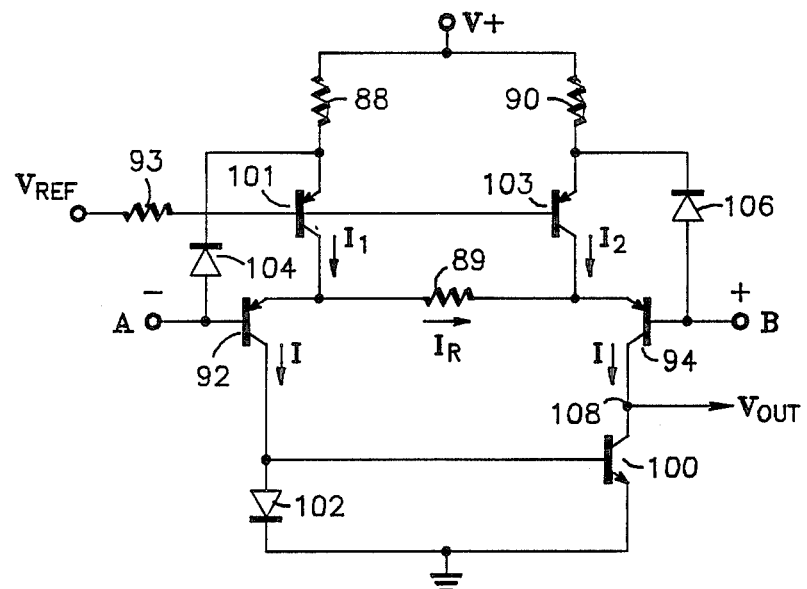
FIG. 5 is a schematic diagram of the inventive operational amplifier circuit.

FIG. 5 is a schematic diagram of the input stage of an operational amplifier including RTMM resistors 88 and 90. As can be seen, input PNP transistors 92 and 94 have their base terminals coupled to inputs A and B respectively. Resistor 89 is coupled between the emitter of transistor 92 and the emitter of transistor 94. The collectors of transistors 92 and 94 are coupled to a current mirror circuit comprised of NPN transistor 100 and diode 102. First and second PNP current source transistors 101 and 103 each have their base electrodes coupled to a reference voltage ($V_{REF}$) through resistor 93. The emitter of transistor 101 is coupled to a first terminal of RTMM resistor 88, and the collector of transistor 101 is coupled to a common point between the emitter of transistor 92 and resistor 89. Transistor 103 has its emitter coupled to a first terminal of RTMM resistor 90 and a collector coupled to a common point between the emitter of transistor 94 and resistor 89. The second terminals of RTMM resistors 88 and 90 are coupled through a source of supply voltage (V+). A first diode 104 has its anode coupled to input terminal A and its cathode coupled to a common node between the emitter of transistor 101 and the first terminal of RTMM resistor 88. A second diode 106 has its anode coupled to input terminal B and its cathode coupled to a common node between the emitter of transistor 103 and the first terminal of RTMM resistor 90.

Ignoring for the moment resistors 88 and 90 and diodes 104 and 106, the input stage operates in the well known manner. Should the voltage at terminal A exceed that at terminal B, the current flowing through transistor 92 will be lower than that flowing through transistor 94. Through the action of the current mirror circuit, transistor 100 will attempt to pull from node 108 a current substantially equal to that flowing in the collector of transistor 92. Since this is less than the current flowing into node 108 from the collector of transistor 94, the voltage at node 108 will rise. Conversely, should the voltage at node A be less than that at node B, more current will flow in the collector of transistor 92 than flows in the collector of transistor 94. However, due to the current mirror action, transistor 100 will attempt to pull more current out of node 108 than is being supplied thereto and as a result, the voltage at node 108 will fall.

Should a positive offset voltage exist between input terminals A and B, it may be substantially reduced by increasing the current flowing through resistor 89 (IR) as previously described in connection with FIG. 4. This in turn may be accomplished by increasing current $I_1$ relative to $I_2$. Since $I_1$ equals $(V_{CC} - V_{BE101} - V_{REF})/R_{88}$ where $V_{BE101}$ is the base-emitter voltage of transistor 101 and $R_{88}$ is the resistance of RTMM resistor 88, it should be clear that $I_1$ may be increased by reducing the resistance of RTMM resistor 88.

Typically, the signals appearing at the input terminals A and B reside somewhere between the upper and lower rail voltages (e.g. ground and V+). Thus, diodes 104 and 106 generally remain reverse biased. Should it be desired to reduce the resistance of RTMM resistor 88 for the purpose of reducing a positive $V_{OS}$, it is only necessary to pull input terminal A above V+ to forward bias diode 104 so as to conduct a large current through RTMM resistor 88. As previously described, this will cause the resistance of RTMM resistor 88 to be reduced by metal migration. By reducing the value of RTMM resistor 88, current $I_1$ will be increased by a differential current ($\Delta I$) causing current $I_R = (\Delta I/2)$ to flow through resistor 89 producing a $(\Delta I/2)R_{89}$ change in $V_{OS}$. Due to the current mirror action, the base current of transistor 92 and its collector current is still equal to the base current of transistor 94 and its collector current.

Should a negative offset voltage exist, it may be similarly reduced by pulling input terminal B above V+ so as to forward bias diode 106 and cause a high current to flow through RTMM resistor 90 reducing the resistance thereof.

Figure 6:
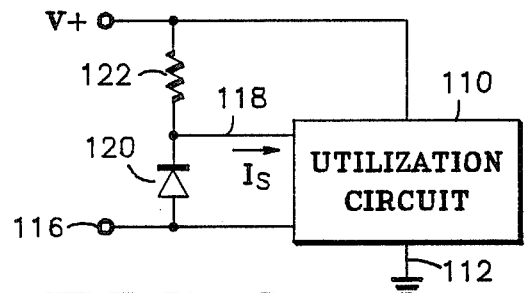
FIGS. 6 and 7 illustrate generally how an RTMM resistor may be utilized in conjunction with any circuit exhibiting a parameter which must be trimmed.

Thus far, this trimming technique from an input terminal to the positive rail has been described in connection with the operational amplifier shown in FIG. 5. It should be apparent however that such a technique may be appropriately used in connection with any utilization circuit wherein an internal parameter is to be modified by modifying the current flowing into the utilization circuit. For example, referring to FIG. 6, a utilization circuit 110 has a first supply rail 112 (e.g. ground) and a second supply rail 114 (V+). In addition, the utilization circuit has a first input 116 for receiving an input signal and a second input 118 for receiving current $I_S$. As can be seen, diode 120 has an anode coupled to input 116 and a cathode coupled to input 118. An RTMM resistor 122 is coupled between input 118 and V+. By pulling input 116 above V+, diode 120 becomes forward biased causing a high current to flow through resistor 122 reducing the resistance thereof. In this manner, current $I_S$ flowing into utilization circuit 110 may be altered to effect a desired internal parameter change.

Figure 7:
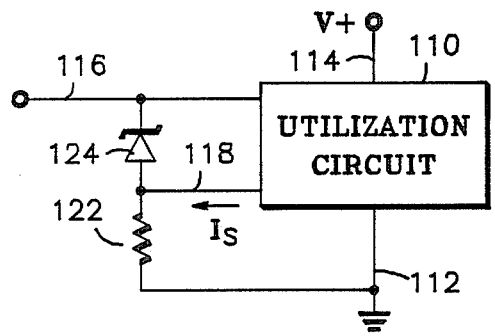

In FIG. 7, utilization circuit 110 also has a first supply rail 112, a second supply rail 114, a first input 116 and a second input 118. In this case, however, a zener diode has a cathode coupled to input 116 and an anode coupled to input 118, RTMM resistor 122 is coupled between input 118 and rail 112 (typically ground). To assure that current flows through RTMM resistor 122 only when it is desired to alter the resistance thereof, zener diode 124 is chosen to have a predetermined breakdown voltage (e.g. 7 volts). A plurality of zener diodes could be utilized for different voltage requirements. Nevertheless, by placing a high enough voltage on input 116 with respect to the first supply voltage 112, current flows through RTMM resistor 122 causing its resistance to change and thus altering $I_S$.

Thus, there has been shown and described, a circuit wherein input offset voltages or any other current dependent parameters may be altered through the use of RTMM resistors coupled between an input terminal and one of the power supply rails.

The above description is given by way of example only. Changes in form and details may be made by one skilled in the art without departing from the scope of the invention as defined by the appended claims.

We claim:

1. An apparatus for altering an electrical parameter of a utilization circuit having at least first and second inputs and at least a first power supply rail, said apparatus comprising:
   diode means coupled between said at least first and second inputs for conducting current from said first input to said second input when the voltage at said first input exceeds a predetermined value; and
   RTMM resistor means coupled between said second input and said power supply rail.

2. An apparatus according to claim 1 wherein said diode means comprises at least one diode having an anode coupled to said first input and a cathode coupled to said second input.

3. An apparatus according to claim 2 wherein said utilization circuit includes first and second power supply rails, said first power supply rail for coupling to a higher voltage than said second power supply rail, and wherein said RTMM resistor means is coupled between said second input and said first power supply rail.

4. An apparatus according to claim 3 wherein said utilization circuit comprises:
   an operational amplifier integrated circuit formed in a semiconductor substrate of the type which includes:
   first and second differentially coupled input transistors each having a base electrode coupled to first and second nodes respectively, and each having emitter and collector terminals;
   first means for coupling to the emitter terminals of said first and second input transistors for supplying current thereto; and
   current mirror means coupled to the collector terminals of said first and second input transistors.

5. An apparatus according to claim 4 wherein said diode means comprises a diode having an anode and a cathode and said RTMM resistor means comprises an RTMM resistor having first and second terminals, the cathode of said diode being coupled to the first terminal of said RTMM resistor, and the second terminal of said RTMM resistor being coupled to said first power supply rail.

6. An apparatus according to claim 5 wherein said RTMM resistor comprises:
   a resistive region in said substrate having first and second ends; and
   first and second metallic contacts for contacting said first and second terminals of said resistive region.

7. An apparatus according to claim 6 wherein said substrate is silicon and said first and second metallic contacts are alluminum.

8. An apparatus according to claim 7 wherein said substrate is a {111} crystal substrate and said resistors is disposed in a direction selected from the group consisting of [112], [121], and [211].

9. An apparatus according to claim 1 wherein said at least one diode is a zener diode.

10. An apparatus according to claim 9 wherein said utilization circuit includes first and second power supply rails, said first power supply rail for coupling to a higher voltage than said second power supply rail, and wherein said RTMM resistor means is coupled between said second input and said second power supply rail.

* * * * *